(12) United States Patent
Takemura

(10) Patent No.: US 9,812,560 B2
(45) Date of Patent: Nov. 7, 2017

(54) FIELD EFFECT TRANSISTOR AND METHOD FOR MANUFACTURING THE SAME

(71) Applicant: Semiconductor Energy Laboratory Co., Ltd., Atsugi-shi, Kanagawa-ken (JP)

(72) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/542,705

(22) Filed: Nov. 17, 2014

(65) Prior Publication Data

US 2015/0072471 A1 Mar. 12, 2015

Related U.S. Application Data

(63) Continuation of application No. 13/114,634, filed on May 24, 2011, now Pat. No. 8,895,375.

(30) Foreign Application Priority Data

Jun. 1, 2010 (JP) .................................. 2010-125443

(51) Int. Cl.
*H01L 29/24* (2006.01)
*H01L 29/66* (2006.01)
(Continued)

(52) U.S. Cl.
CPC .. *H01L 29/66969* (2013.01); *H01L 21/02266* (2013.01); *H01L 21/02565* (2013.01);
(Continued)

(58) Field of Classification Search
CPC ............. H01L 29/242; H01L 21/02565; H01L 29/7869
See application file for complete search history.

(56) References Cited

U.S. PATENT DOCUMENTS 5,087,584 A * 2/1992 Wada ................ H01L 27/11517
148/DIG. 50
5,731,856 A 3/1998 Kim et al.
(Continued)

FOREIGN PATENT DOCUMENTS

EP 0855614 A 7/1998
EP 1445793 A 8/2004
(Continued)

OTHER PUBLICATIONS

Jackson.W et al., "58.3:Fabrication of Zinc Tin Oxide TFTs by Self-Aligned Imprint Lithography (SAIL) on Flexible Substrates", SID Digest '09 : SID International Symposium Digest of Technical Papers, May 31, 2009, pp. 873-876.
(Continued)

*Primary Examiner* — Amar Movva
(74) *Attorney, Agent, or Firm* — Fish & Richardson P.C.

(57) ABSTRACT

Provided is a novel structure of a field effect transistor using a metal-semiconductor junction. The field effect transistor includes a wiring which is provided over a substrate and also functions as a gate electrode; an insulating film which is provided over the wiring, has substantially the same shape as the wiring, and also functions as a gate insulating film; a semiconductor layer which is provided over the insulating film and includes an oxide semiconductor and the like; an oxide insulating layer which is provided over the semiconductor layer and whose thickness is 5 times or more as large as the sum of the thickness of the insulating film and the thickness of the semiconductor layer or 100 nm or more; and wirings which are connected to the semiconductor layer through openings provided in the oxide insulating layer.

19 Claims, 7 Drawing Sheets

(51) Int. Cl.
  *H01L 27/12*  (2006.01)
  *H01L 29/786* (2006.01)
  *H01L 21/02*  (2006.01)
  *H01L 21/385* (2006.01)
  *H01L 21/477* (2006.01)
  *H01L 27/13*  (2006.01)

(52) U.S. Cl.
  CPC ...... *H01L 21/02614* (2013.01); *H01L 21/385* (2013.01); *H01L 21/477* (2013.01); *H01L 27/1225* (2013.01); *H01L 27/1255* (2013.01); *H01L 29/242* (2013.01); *H01L 29/7869* (2013.01); *H01L 27/13* (2013.01)

(56) References Cited

U.S. PATENT DOCUMENTS

| | | | |
|---|---|---|---|
| 5,744,864 A | 4/1998 | Cillessen et al. | |
| 5,989,945 A | 11/1999 | Yudasaka et al. | |
| 6,294,274 B1 | 9/2001 | Kawazoe et al. | |
| 6,380,011 B1* | 4/2002 | Yamazaki et al. | 438/163 |
| 6,563,174 B2 | 5/2003 | Kawasaki et al. | |
| 6,593,591 B2 | 7/2003 | Yudasaka et al. | |
| 6,727,522 B1 | 4/2004 | Kawasaki et al. | |
| 6,833,896 B2 | 12/2004 | Lee | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,067,337 B2 | 6/2006 | Yudasaka et al. | |
| 7,105,868 B2 | 9/2006 | Nause et al. | |
| 7,211,825 B2 | 5/2007 | Shih et al | |
| 7,229,859 B2 | 6/2007 | Yudasaka et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,420,213 B2* | 9/2008 | Chae et al. | 257/72 |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,636,135 B2 | 12/2009 | Wang et al. | |
| 7,674,650 B2 | 3/2010 | Akimoto et al. | |
| 7,732,819 B2 | 6/2010 | Akimoto et al. | |
| 8,178,884 B2 | 5/2012 | Ha et al. | |
| 8,193,535 B2 | 6/2012 | Ha et al. | |
| 8,728,862 B2 | 5/2014 | Ha et al. | |
| 2001/0046027 A1 | 11/2001 | Tai et al. | |
| 2002/0056838 A1 | 5/2002 | Ogawa | |
| 2002/0074547 A1 | 6/2002 | Yudasaka et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0183074 A1* | 9/2004 | Jinno et al. | 257/66 |
| 2005/0017302 A1 | 1/2005 | Hoffman | |
| 2005/0199879 A1 | 9/2005 | Hoffman et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0269937 A1 | 11/2007 | Lin | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0001374 A1 | 1/2009 | Inoue et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0006833 A1 | 1/2010 | Ha et al. | |
| 2010/0059804 A1* | 3/2010 | Hayashi et al. | 257/292 |
| 2010/0065844 A1 | 3/2010 | Tokunaga | |
| 2010/0072467 A1 | 3/2010 | Yamazaki et al. | |
| 2010/0092800 A1 | 4/2010 | Itagaki et al. | |
| 2010/0109002 A1 | 5/2010 | Itagaki et al. | |
| 2010/0117075 A1 | 5/2010 | Akimoto et al. | |
| 2010/0123138 A1 | 5/2010 | Choi et al. | |
| 2010/0301328 A1 | 12/2010 | Yamazaki et al. | |
| 2011/0003427 A1 | 1/2011 | Sasaki et al. | |
| 2011/0024750 A1 | 2/2011 | Yamazaki et al. | |
| 2011/0024751 A1 | 2/2011 | Yamazaki et al. | |
| 2011/0031491 A1 | 2/2011 | Yamazaki et al. | |
| 2011/0037068 A1 | 2/2011 | Yamazaki et al. | |
| 2011/0068336 A1 | 3/2011 | Yamazaki et al. | |
| 2011/0101335 A1 | 5/2011 | Yamazaki et al. | |

FOREIGN PATENT DOCUMENTS

| | | |
|---|---|---|
| EP | 1450412 A | 8/2004 |
| EP | 1737044 A | 12/2006 |
| EP | 1981085 A | 10/2008 |
| EP | 2144294 A | 1/2010 |
| EP | 2226847 A | 9/2010 |
| JP | 60-198861 A | 10/1985 |
| JP | 61-203484 A | 9/1986 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 02-214124 A | 8/1990 |
| JP | 05-251705 A | 9/1993 |
| JP | 08-264794 A | 10/1996 |
| JP | 10-189994 A | 7/1998 |
| JP | 11-505377 | 5/1999 |
| JP | 2000-044236 A | 2/2000 |
| JP | 2000-150900 A | 5/2000 |
| JP | 2001-311965 A | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-318165 A | 11/2004 |
| JP | 2007-258675 A | 10/2007 |
| JP | 2008-070876 A | 3/2008 |
| JP | 2008-175930 A | 7/2008 |
| JP | 2009-224479 A | 10/2009 |
| JP | 2010-016072 A | 1/2010 |
| JP | 2010-021520 A | 1/2010 |
| KR | 2010-0056649 A | 5/2010 |
| WO | WO-2004/114391 | 12/2004 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Nemiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 :SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT"SID Digest '08 : SID International Symposium Digest of Technical Papers, May 20, 2008, vol. 39, pp. 625-628.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In AMOLED Display With Driver Circuit Using Amorphous In—Ga—Zn—Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5') Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications" SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214TH ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

FIELD EFFECT TRANSISTOR AND METHOD FOR MANUFACTURING THE SAME

CROSS-REFERENCE TO RELATED APPLICATIONS

This application is a continuation of U.S. application Ser. No. 13/114,634, filed May 24, 2011, now allowed, which claims the benefit of a foreign priority application filed in Japan as Serial No. 2010-125443 on Jun. 1, 2010, both of which are incorporated by reference.

BACKGROUND OF THE INVENTION

1. Field of the Invention

The present invention relates to a field effect transistor (FET) including a semiconductor.

2. Description of the Related Art

In a field effect transistor (hereinafter referred to as a FET), regions called a source and a drain are provided in a semiconductor. Voltage is applied to the semiconductor from a region called a gate through an insulating film or a Schottky barrier in the state where voltage is applied between the source and the drain, so that the state of the semiconductor is controlled; thus, current flowing between the source and the drain is controlled. As the semiconductor, an element such as silicon or germanium, a compound such as gallium arsenide, indium phosphide, gallium nitride, zinc sulfide, or cadmium telluride, or the like can be used.

In recent years, FETs including an oxide such as zinc oxide or an indium gallium zinc oxide-based compound as the semiconductor have been reported (Patent Document 1 and Patent Document 2). In a FET including such an oxide semiconductor, relatively high mobility can be obtained, and such a material has a wide band gap of greater than or equal to 3 electron volts; therefore, application of the FET including an oxide semiconductor to displays, power devices, and the like is discussed.

Meanwhile, so far there have been few reports on an oxide semiconductor which contains zinc or indium and has p-type conductivity. Thus, an oxide semiconductor using a PN junction like a silicon FET has not been reported. As in Patent Document 1 and Patent Document 2, a source and a drain are formed using a metal-semiconductor junction in which an n-type or i-type oxide semiconductor (in this specification, a semiconductor whose concentration of carriers derived form a donor is $10^{12}/cm^3$ or lower is called an i-type semiconductor) is in contact with metal electrodes.

Note that in a FET having a sufficiently long channel, donor concentration is substantially equal to carrier concentration. However, in a FET having a short channel (for example, the channel length is 0.2 μm or smaller), the donor concentration is not always equal to the carrier concentration (or electron concentration). In this specification, the FET having a sufficiently long channel length will be discussed below.

Unlike a PN-junction FET, in a FET where a source and a drain are formed using a metal-semiconductor junction, when the carrier concentration in a semiconductor is high, current (off-state current) flows between the source and the drain even in an off state. Therefore, the off-state current has needed to be reduced by lowering the carrier concentration in the semiconductor so that an i-type semiconductor is obtained.

FIGS. 4A to 4C are cross-sectional views illustrating an example of processes for manufacturing a conventional bottom-gate FET including an oxide semiconductor. FIGS. 4A to 4C are cross sections along line A-B in FIG. 4D. First, a conductive layer is formed over a substrate 201 and etched into a desired shape, so that wirings 202a and 202b which also function as gate electrodes are formed. The wirings 202a and 202b are also used as wirings in circuits (for example, scan lines in an active-matrix display device).

Then, an insulating film 203 which also functions as a gate insulating film is formed so as to cover the wirings 202a and 202b. Further, an oxide semiconductor layer is formed and etched into a desired shape, so that semiconductor layers 204a and 204b are obtained (FIG. 4A). A top view of this stage is FIG. 4D.

Next, another conductive layer which is in contact with the semiconductor layers 204a and 204b is formed and etched into a desired shape, so that wirings 205a and 205b are obtained (FIG. 4B). Part of the wirings 205a and 205b also function as a source and a drain of the semiconductor layers 204a and 204b.

The wirings 205a and 205b can be directly used as wirings in circuits (for example, data lines in an active-matrix display device); however, in that case, parasitic capacitance between the wirings is high because only the insulating film 203 is placed between the wirings 202a and 202b and the wirings 205a and 205b.

In particular, in a FET using a metal-semiconductor junction, when a gate insulating film is thicker, the threshold voltage shifts negatively (in the case of an n-channel FET) and the FET is normally on. Therefore, the thickness of the insulating film 203 needs to be 100 nm or less; however, in that case, the parasitic capacitance between the wirings 202a and 202b and the wirings 205a and 205b becomes higher.

Because of such problems, a planarization insulating layer 206 is usually formed as illustrated in FIG. 4C. Openings reaching the wirings 205a and 205b are formed in the planarization insulating layer 206, and wirings 207a and 207b are further formed so as to be connected to the wirings 205a and 205b through the openings. The wirings 207a and 207b are used as data lines in an active-matrix display device for example.

Meanwhile, it has been pointed out that hydrogen is a source for supplying carriers particularly in an oxide semiconductor. Therefore, some measures need to be taken to prevent hydrogen from entering the oxide semiconductor at the time of depositing the oxide semiconductor. It is also pointed out that hydrogen needs to be prevented from entering not only the oxide semiconductor but also an insulating film in contact with the oxide semiconductor (see Patent Document 3).

In order to prevent the entrance of hydrogen, it is considered that the insulating film 203 is preferably formed by a sputtering method in which a material that hardly contains hydrogen can be used instead of a CVD method (e.g., a plasma CVD method or a low-pressure CVD method) in which a material containing hydrogen has to be used.

An insulating film formed by a sputtering method, however, does not have sufficient step coverage, resulting in an insufficient insulating property particularly in a step portion. Therefore, there is a problem in that leakage current is increased when a wiring or a semiconductor layer is formed so as to overlap with a step portion.

REFERENCE

Patent Document

[Patent Document 1] United States Published Patent Application No. 2005/0199879
[Patent Document 2] United States Published Patent Application No. 2007/0194379
[Patent Document 3] Japanese Published Patent Application No. 2009-224479

SUMMARY OF THE INVENTION

An object of one embodiment of the present invention is to provide a method for manufacturing a FET having stable characteristics. Another object is to provide a novel FET having a structure suitable for the above object.

In some steps of the method illustrated in FIGS. 4A to 4D, there has been the possibility that a substance containing hydrogen (e.g., water, hydroxide compounds, or hydrogen compounds) remains. The present inventor assumed that a problem of the method illustrated in FIGS. 4A to 4D was that hydrogen that remained in that manner was not removed or could not be removed in later steps.

For example, when the insulating film 203 is formed by a plasma CVD method, a large amount of hydrogen remains in the film. In order to reduce the concentration of the hydrogen to a sufficiently low concentration, treatment at considerably high temperatures has been necessary; however, when heat resistance of the substrate 201 or the wirings 202a and 202b is not high enough, such a method cannot be employed.

On the other hand, when the insulating film 203 is formed by a sputtering method by which the hydrogen concentration can be sufficiently reduced, there is another problem in that the withstand voltage is insufficient because of the above-described problem of step coverage.

One embodiment of the present invention provides a method for manufacturing a FET or a structure of a FET in which the hydrogen concentration can be sufficiently reduced even when an insulating film which corresponds to the insulating film 203 is formed by a plasma CVD method.

Another embodiment of the present invention provides a method for manufacturing a FET or a structure of a FET in which the withstand voltage is sufficiently high even when an insulating film which corresponds to the insulating film 203 is formed by a sputtering method.

In addition, another object of one embodiment of the present invention is to provide a novel semiconductor device including a FET. Another object of one embodiment of the present invention is to provide a method for driving the novel semiconductor device including a FET. Further, another object of one embodiment of the present invention is to provide a method for manufacturing the novel semiconductor device including a FET.

Note that the description of these objects does not disturb the existence of other objects. Note that one embodiment of the present invention does not necessarily achieve all the objects listed above. In addition, other objects will be apparent from and can be derived from the description of the specification, the drawings, the claims, and the like.

The present invention will be described below; terms used in this specification are briefly explained. Note that terms which are not defined (including terms used for science and technology, such as technical terms or academic parlance) can be used as the terms which have meaning equal to general meaning that an ordinary person skilled in the art understands. It is preferable that terms defined by dictionaries or the like be construed as consistent meaning with the background of related art.

First, a "wiring" in this specification does not always mean a linear component. In some cases, a "wiring" means a film-like component or a stick-like component. For example, a component having a shape like a contact plug is included in the category of a "wiring" in some cases. In addition, a combination of a contact plug and a thin conductive film which is in contact with the contact plug is referred to as a "wiring" in some cases.

Second, terms for describing spatial arrangement, such as "over", "above", "under", "below", "laterally", "right", "left", "obliquely", "back", "front", "inside", "outside", and "in", are often used for briefly showing, with reference to a drawing, a relation between an element and another element or between some characteristics and other characteristics.

Note that such terms for describing spatial arrangement can indicate, without limitation, not only the direction illustrated in a drawing but also another direction. For example, the case where "Y over X" is explicitly described does not necessarily mean that Y is placed over X. The case where Y is placed under X can be included because components illustrated in a drawing can be inverted or rotated by 180°.

In a similar manner, "over" can indicate the direction described by "under" in addition to the direction described by "over". Note that without limitation to these directions, "over" can indicate any of the other directions described by "laterally", "right", "left", "obliquely", "back", "front", "inside", "outside", and "in" in addition to the directions described by "over" and "under" because a device in a drawing can be rotated in a variety of directions. That is, the terms for describing spatial arrangement can be construed adequately depending on the situation.

In addition, the expression "over" or "under" does not deny the existence of a space or a component between other components. For example, the description "B is provided over A" includes the case where another component C exists between A and B.

Further, the expression "substantially equal" includes the case where a small difference such as a manufacturing error or a difference which does not substantially affect the operation exists. For example, the expression "substantially equal" indicates the case where a difference between components is less than 10%, preferably less than 5%. In a similar manner, the expression "substantially the same shape" includes the case where a difference which does not substantially affect the operation exists.

Note that in this specification and the like, explicit singular forms preferably mean singular forms. However, without being limited thereto, such singular forms can mean plural forms. In a similar manner, explicit plural forms preferably mean plural forms. However, without being limited thereto, such plural forms can mean singular forms.

One embodiment of the present invention is a field effect transistor including a substrate, a first wiring provided over the substrate, an insulating film which is provided over the first wiring and has substantially the same shape as the first wiring, a semiconductor layer provided over the insulating film, an oxide insulating layer provided over the semiconductor layer, and a second wiring connected to the semiconductor layer through an opening provided in the oxide insulating layer.

Another embodiment of the present invention is a method for manufacturing a field effect transistor including a step for forming a first conductive layer over a substrate, a step for forming an insulating film over the first conductive layer, a step for processing the insulating film into a predetermined shape, a step for processing the first conductive layer into substantially the same shape as the insulating film, a step for forming a semiconductor layer over the insulating film, a step for forming an oxide insulating layer over the semiconductor layer, a step for providing an opening reaching the semiconductor layer in the oxide insulating layer, and a step for forming a second conductive layer covering the oxide insulating layer.

The semiconductor layer in the above embodiment is formed using any kind of semiconductors. For example, any kind of compound semiconductors such as an oxide semiconductor, a sulfide semiconductor, a selenium compound semiconductor, or a tellurium compound semiconductor, a mixture of these semiconductors, or a compound of these semiconductors may be used. The semiconductor layer preferably contains indium and zinc, or indium and gallium. For example, an oxide semiconductor whose nominal stoichiometry can be represented by $In_aGa_bZn_eO_d$ may be used. Here, $0 \le a \le 1$, $0 \le b \le 1$, $0 \le c \le 1$, and $a+b+c=1$ are satisfied. The oxide semiconductor layer may contain at least one element selected from In, Ga, Sn, Zn, Al, Mg, Hf and lanthanoid. For example, a four-component metal oxide such as an In—Sn—Ga—Zn—O-based oxide semiconductor; a three-component metal oxide such as an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, an In—Hf—Zn—O-based oxide semiconductor, an In—La—Zn—O-based oxide semiconductor, an In—Ce—Zn—O-based oxide semiconductor, an In—Pr—Zn—O-based oxide semiconductor, an In—Nd—Zn—O-based oxide semiconductor, an In—Pm—Zn—O-based oxide semiconductor, an In—Sm—Zn—O-based oxide semiconductor, an In—Eu—Zn—O-based oxide semiconductor, an In—Gd—Zn—O-based oxide semiconductor, an In—Tb—Zn—O-based oxide semiconductor, an In—Dy—Zn—O-based oxide semiconductor, an In—Ho—Zn—O-based oxide semiconductor, an In—Er—Zn—O-based oxide semiconductor, an In—Tm—Zn—O-based oxide semiconductor, an In—Yb—Zn—O-based oxide semiconductor, an In—Lu—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single-component metal oxide such as an In—O-based oxide semiconductor, a Sn—O-based oxide semiconductor, or a Zn—O-based oxide semiconductor; or the like can be used. In addition, any of the above oxide semiconductors may contain, for example, $SiO_2$.

The thickness of the oxide insulating layer is preferably 5 times or more as large as the sum of the thickness of the insulating film and the thickness of the semiconductor layer. Alternatively, the thickness of the oxide insulating layer may be 100 nm or more. In addition, the oxide insulating layer is preferably formed by a sputtering method.

Further, the edge of the semiconductor layer is preferably placed inside the edge of the insulating film. The opening preferably overlaps with the semiconductor layer.

Note that modes where the above objects are achieved are not limited to the above embodiments. Note that in the case where at least one specific example is described in text or illustrated in a drawing in one embodiment in this specification and the like, it will be readily appreciated by those skilled in the art that a broader concept of the specific example can be derived. Therefore, in the case where at least one specific example is shown in a drawing or text in one embodiment, a broader concept of the specific example is disclosed as one embodiment of the present invention and can constitute one embodiment of the present invention.

Note that in this specification and the like, contents illustrated in at least a drawing (which may be part of the drawing) are disclosed as one embodiment of the present invention and can constitute one embodiment of the present invention. Therefore, when certain contents are illustrated in a drawing, the contents are disclosed as one embodiment of the present invention even when the contents are not described in texts and can constitute one embodiment of the present invention. In a similar manner, even part of a drawing is disclosed as one embodiment of the present invention and can constitute one embodiment of the present invention.

By employing any of the above-described structures, at least one of the above-described objects can be achieved. That is, the insulating film can be formed by a CVD method or a sputtering method. According to one embodiment of the present invention, the semiconductor layer or the wiring can be prevented from overlapping with a step portion, so that insufficient insulation due to insufficient step coverage in the step portion can be suppressed.

In addition, according to one embodiment of the present invention, even when the insulating film is formed by a CVD method, oxygen diffuses from the oxide insulating layer formed over the insulating film by heat treatment at 200° C. or higher, so that hydrogen existing in the insulating film can be oxidized to be fixed as water or released as water from the insulating film. Accordingly, the hydrogen concentration in the insulating film can be sufficiently reduced.

Note that in a FET of the present invention, the thickness of the insulating film is 100 nm or less, typically greater than or equal to 5 nm and less than or equal to 50 nm; therefore, the hydrogen concentration in the insulating film cannot be measured accurately. Thus, whether the hydrogen concentration is sufficiently reduced is judged indirectly by conducting a gate bias-temperature stress test (BT test). In this specification, the hydrogen concentration is judged to be sufficiently reduced when a change in the threshold voltage is 0.1 volts or lower by the BT test (150° C., 1 hour, gate bias: +2 MV/cm or −2 MV/cm). Characteristics of a FET including an insulating film in which the hydrogen concentration has been assumed to be sufficiently reduced in this manner are extremely stable.

Note that effects of the present invention are not limited to the above. Another effect described in the other part of this specification can be handled as an effect of a corresponding embodiment of the present invention.

DETAILED DESCRIPTION OF THE INVENTION

Figure 1A:
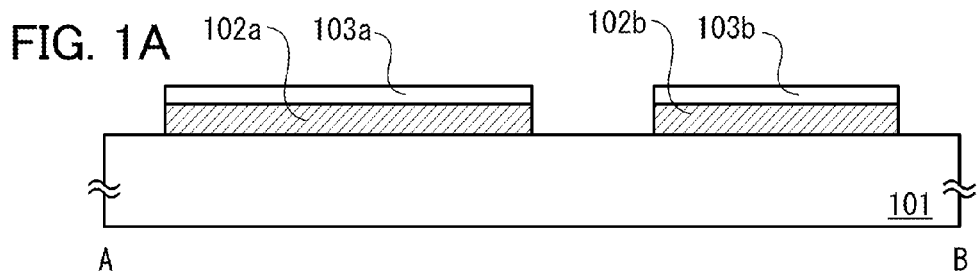
FIGS. 1A to 1D illustrate an example of processes for manufacturing a field effect transistor of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Therefore, this invention is not interpreted as being limited to the description of the embodiments below. Note that in structures of the present invention described below, the same portions or portions having similar functions are denoted by the same reference numerals, and detailed description thereof is not repeated.

(Embodiment 1)

Figure 1B:
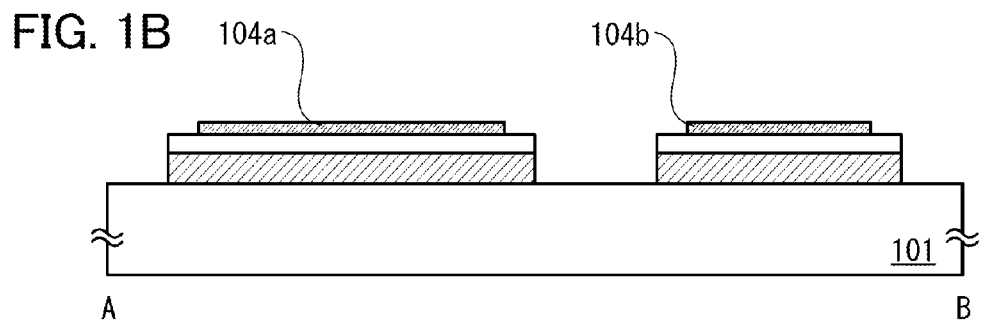
Figure 1C:
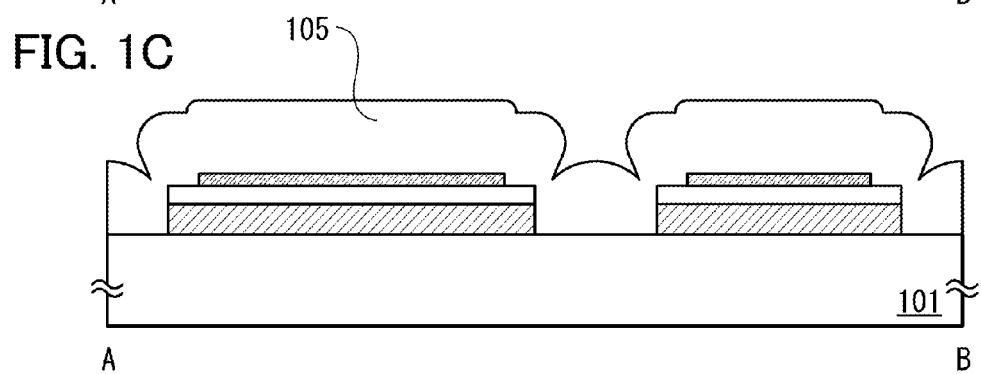
Figure 1D:
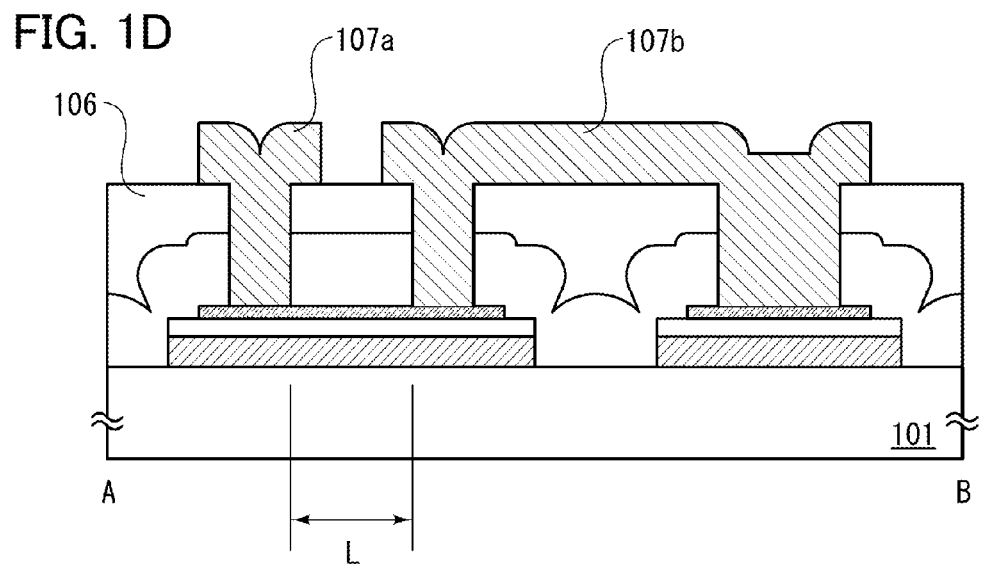
Figure 2A:
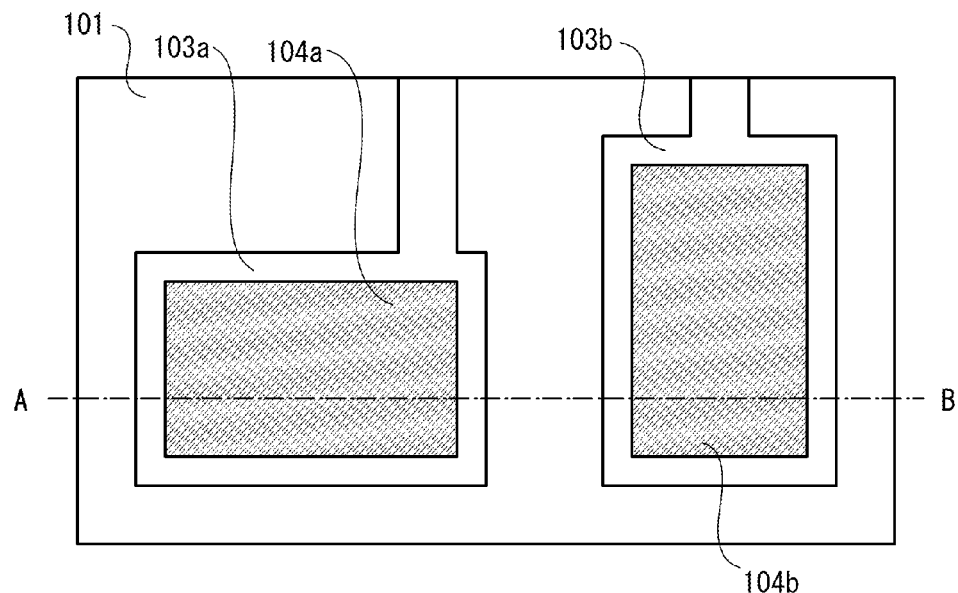
FIGS. 2A and 2B illustrate an example of processes for manufacturing a field effect transistor of the present invention.
Figure 2B:
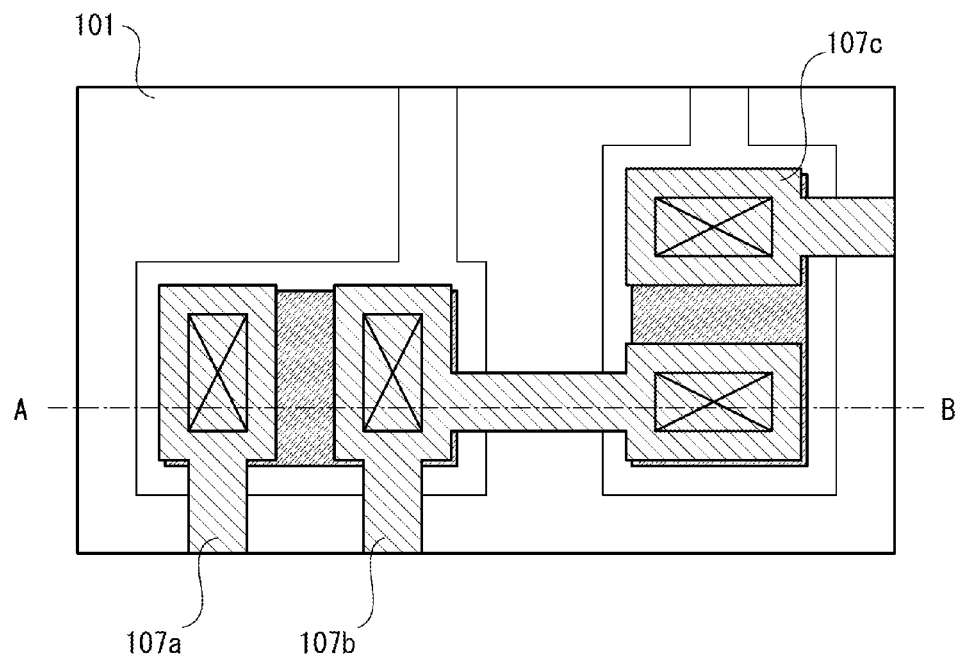

FIGS. 1A to 1D illustrate cross-sectional views of processes for manufacturing a FET which is one embodiment of the present invention and FIGS. 2A and 2B illustrate top views of the processes for manufacturing the FET which is one embodiment of the present invention. FIGS. 1A to 1D are cross sections along line A-B in FIGS. 2A and 2B.

First, a conductive layer and an insulating film are formed over a substrate 101. The conductive layer and the insulating film can be formed by applying any deposition method; however, it is preferable that a deposition method such as a sputtering method, a CVD method, or a laser ablation method, which is performed in a state where an atmosphere is sufficiently managed, be employed and that the insulating film be formed without exposure of the conductive layer to the air after formation of the conductive layer.

The conductive layer can be formed using any kind of materials. For example, for the conductive layer, any kind of metals such as tungsten, molybdenum, platinum, or chromium, nitride thereof, a semiconductor such as p-type silicon, oxide such as indium oxide, or the like may be used. In particular, in order to make a FET to be normally off, considering the electron affinity of a semiconductor layer which is to be formed later, a material having a work function higher than or equal to the electron affinity is preferably used. In addition, the conductive layer may have a multi-layer structure. In that case, it is preferable that the uppermost layer be formed using such a material that is selected by considering the electron affinity of the semiconductor layer and that the other layer(s) be formed using a material/materials having high conductivity or heat resistance. The thickness of the conductive layer is preferably decided in consideration of resistance in the case of being used as a wiring. Typically, the thickness thereof may be greater than or equal to 100 nm and less than or equal to 500 nm.

In addition, the insulating film can also be formed using any kind of materials. For example, silicon oxide, silicon oxynitride, silicon nitride, aluminum oxide, aluminum nitride, hafnium oxide, aluminum oxynitride, or the like may be used. The thickness and permittivity of the insulating film influence characteristics of the FET. In general, with a thin insulating film having high permittivity, the threshold voltage of the FET is positive. However, when the insulating film is too thin, leakage current is greatly increased and the withstand voltage is reduced. Typically, the thickness of the insulating film may be greater than or equal to 5 nm and less than or equal to 50 nm.

Note that in formation of the conductive layer, it is necessary to sufficiently reduce the hydrogen concentration in an atmosphere to prevent hydrogen, hydrogen compounds, and hydroxides from mixing into the conductive layer as much as possible. The conductive layer is often used as a wiring for which the thickness is relatively large (100 nm or more) in order to reduce the resistance. If hydrogen and the like are contained at high concentration in such a thick layer, hydrogen cannot be sufficiently prevented from diffusing into the semiconductor layer from the conductive layer also in later treatment.

Many metals have properties of absorbing hydrogen. Therefore, in the case where a metal or an alloy is used for the conductive layer, it is preferable that the conductive layer be not exposed to hydrogen or hydrogen ions in or after formation of the conductive layer. In addition, the hydrogen concentration in the conductive layer is preferably $1\times10^{18}$/cm$^3$ or lower, more preferably $1\times10^{16}$/cm$^3$ or lower.

Formation of the insulating film without exposing the conductive layer to the air also has an effect of preventing hydrogen and the like from being adsorbed on the conductive layer. For example, in a conventional method illustrated in FIG. 4A, after the conductive layer is formed, patterning is performed in the air by a photolithography method. Further, after the conductive layer is etched, treatment (e.g., separation of a resist) and the like in the air are performed again. Alternatively, the resist is removed by ashing under a reduced pressure in some cases.

In these processes, moisture in the air or in a solution is combined with the conductive layer to be mixed into the conductive layer as a hydroxide in some cases. Alternatively, in some cases, the conductive layer in contact with an acidic solution or an alkaline solution generates hydrogen by electrochemical reaction and absorbs the hydrogen. Further, a substance containing hydrogen (including water) that is formed by decomposition of a resist in ashing is mixed into the conductive layer or combined with the conductive layer in some cases. Such a phenomenon is remarkable particularly in the case of using any kind of metals or an alloy for the conductive layer.

Since a hydroxide formed and hydrogen occluded in this manner are relatively stable, they are unlikely decomposed or released by heat treatment at approximately 200° C. However, they are decomposed or released by an electric action or a sputtering phenomenon in some cases. That is, in some cases, in formation of the insulating film by a plasma CVD method or a sputtering method after formation of the conductive layer, if hydroxides or hydrogen occluded is contained in the conductive layer, hydrogen is released into a deposition atmosphere, thereby being contained in the insulating film to be formed or being moved from the conductive layer to the insulating film. In this manner, hydrogen contained in the insulating film adversely affects characteristics of the FET.

Conventionally, there are no effects of hydroxyls and the like in the conductive layer and hydrogen occluded therein in the case of using a silicon semiconductor and the like, and therefore, such problems have not been considered so far. In addition, although it is known that hydrogen serves as a donor in an oxide semiconductor, hydrogen and the like contained in the conductive layer have not been considered. However, particularly in the case of using an oxide semiconductor or a sulfide semiconductor, there is the possibility that even a minute amount of hydrogen significantly affects characteristics and reliability of a FET; thus, the present inventor found that hydrogen and the like in the conductive layer need to be considered.

Therefore, it is preferable that the conductive layer be exposed neither to the air nor to a solution as much as possible. When the insulating film is formed successively without exposure of the conductive layer to the air, combination of the conductive layer and a substance containing hydrogen such as moisture and occlusion of hydrogen can be suppressed.

After the insulating film is formed, the insulating film is etched and then the conductive layer is etched successively. In this process, the insulating film and the conductive layer may be etched by using a resist mask and the like formed over the insulating film. Alternatively, after the insulating film is etched by using the resist mask, the resist mask may be removed and then the conductive layer may be etched by using the insulating film 103a and 103b, which are formed by the previous etching, as a mask. The conductive layer after being etched serves as the wirings 102a and 102b.

Through the above process, the insulating film 103a and the wiring 102a have substantially the same shape as each other, and the insulating film 103b and the wiring 102b have substantially the same shape as each other. Note that the etching may be performed by wet etching or dry etching. This stage is illustrated in FIG. 1A.

Next, a semiconductor layer is formed. The semiconductor layer can be formed by applying any deposition method; however, it is preferable that a deposition method such as a sputtering method, a CVD method, or a laser ablation method, which is performed in a state where an atmosphere is sufficiently managed, be employed. In order to reduce the hydrogen concentration in the semiconductor layer, the semiconductor layer may be formed with the substrate heated at 200° C. or higher.

The thickness of the semiconductor layer influence characteristics of the FET. In general, with a thin semiconductor layer, the threshold voltage of the FET is positive. However, when the semiconductor layer is too thin, variation in characteristics is greatly increased. Typically, the thickness of the semiconductor layer may be greater than or equal to 5 nm and less than or equal to 50 nm.

Next, the semiconductor layer is etched, so that the semiconductor layers 104a and 104b are formed over the insulating films 103a and 103b, respectively. This stage is illustrated in FIG. 1B and FIG. 2A. As is apparent from FIG. 2A, the semiconductor layers 104a and 104b are formed so as not to overlap with the end portions of the insulating films 103a and 103b.

That is, the edge of the semiconductor layer 104a is placed inside the edge of the insulating film 103a, and the edge of the semiconductor layer 104b is placed inside the edge of the insulating film 103b. With such a structure, step portions of the wirings 102a and 102b do not overlap with the semiconductor layers 104a and 104b; thus, a problem of a reduction in the withstand voltage in the step portion can be eliminated.

Figure 4A:
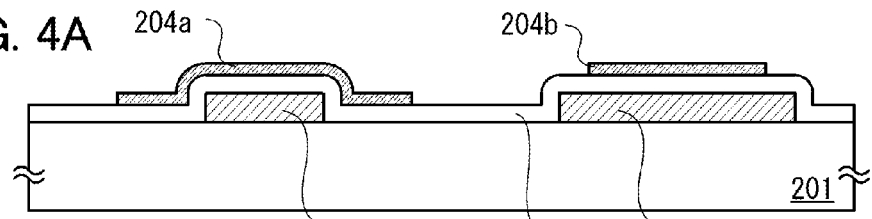
FIGS. 4A to 4D illustrate processes for manufacturing a conventional field effect transistor.
Figure 4B:
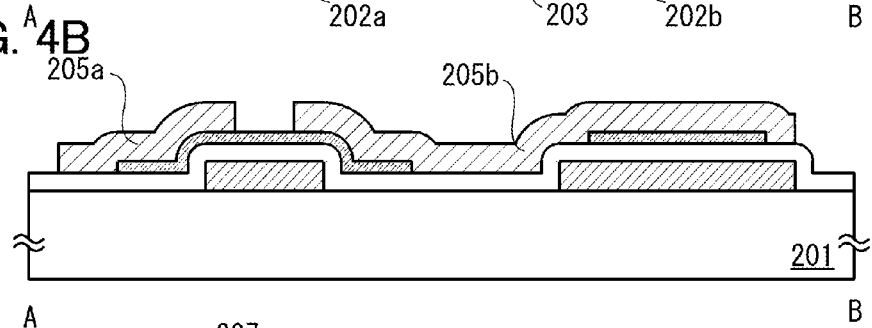

In many cases of formation of the semiconductor layer using an oxide semiconductor, for example, a sputtering method is employed. This is because there is the possibility that mixing of hydrogen and the like into the semiconductor layer can be sufficiently reduced, and a source gas for a CVD method is difficult to obtain. However, by using a sputtering method, it is difficult to form an oxide semiconductor layer with a thickness of 50 nm or lower uniformly over an uneven surface of the insulating film 203 as illustrated in FIG. 4A.

By contrast, as described in this embodiment, with a structure in which the semiconductor layers 104a and 104b do not overlap with the step portions of the wirings 102a and 102b, the semiconductor layer may be formed uniformly over a plane surface; therefore, there is no problem even when the semiconductor layer is formed by a sputtering method. Needless to say, the semiconductor layer is preferably as plane as possible and the root mean square (RMS) of the thickness of the semiconductor layers 104a and 104b is preferably 10 nm or less.

After that, an oxide insulating layer 105 is formed in contact with the semiconductor layers 104a and 104b. For the oxide insulating layer 105, for example, silicon oxide or the like deposited by a sputtering method may be used. It is preferable that the oxide insulating layer 105 have a function of releasing oxygen contained therein by being heated at 200° C. or higher and a function of oxidation. This stage is illustrated in FIG. 1C.

A silicon oxide layer formed by a sputtering method at room temperature contains excessive oxygen at 1% to 10%, typically 3% to 7% in unit volume. With thermal desorption spectroscopy (TDS), it is confirmed that this oxygen is released outside the layer by the heating. With thermal desorption spectroscopy (TDS), it is also confirmed that when an oxide semiconductor layer is formed over such a silicon oxide layer and heating is performed thereon, the amount of oxygen to be released is decreased.

Note that the silicon oxide layer formed by a sputtering method at room temperature is used as the oxide insulating layer 105 in the description here; however, a layer which can be used as the oxide insulating layer 105 is not limited thereto.

Thus, the oxide insulating layer 105 formed using silicon oxide deposited by a sputtering method oxidizes the adjacent semiconductor layers 104a and 104b and the insulating films 103a and 103b by heat treatment. As a result, hydrogen contained in these layers can be fixed or removed. That is, after the oxide insulating layer 105 is formed, heat treatment at 200° C. or higher is preferably performed.

Note that the thickness of the oxide insulating layer 105 is also important in order to perform the above-described oxidation as appropriate. When the oxide insulating layer 105 is too thin as compared with the semiconductor layers 104a and 104b and the insulating films 103a and 103b, sufficient oxidation can not be performed and hydrogen remains in these layers. Therefore, the thickness of the oxide insulating layer 105 is preferably 5 times or more as large as the sum of the thickness of the semiconductor layer 104a and the thickness of the insulating film 103a.

The oxide insulating layer 105 also has a function as an interlayer insulator. The oxide insulating layer 105 also has a function as a protective film for preventing hydrogen and the like from entering the semiconductor layers 104a and 104b from the outside. In order to achieve the above objects, the thickness of the oxide insulating layer 105 is preferably 100 nm or more.

After that, a planarization insulating layer 106 is formed. The planarization insulating layer is not necessarily provided. Another insulating layer may be formed. Then, openings reaching to the semiconductor layers 104a and 104b are formed in the planarization insulating layer 106 and the oxide insulating layer 105. The openings are formed so as to overlap with the insulating films 103a and 103b. The openings are preferably provided so that the edges of the openings are placed away from the edges of the insulating films 103a and 103b by 200 nm or more, more preferably 1 µm or more.

The openings can be formed by wet etching or dry etching. Note that in either case, the etching affects the semiconductor layers 104a and 104b chemically and affects characteristics of the semiconductor layers 104a and 104b in the periphery of the openings in some cases.

For example, in some cases where an oxide semiconductor is used for the semiconductor layers 104a and 104b and the openings are formed by dry etching, oxygen deficiency is generated in the oxide semiconductor in the periphery of the openings owing to the action of plasma, so that the oxide semiconductor becomes an n-type oxide semiconductor.

Further, a conductive layer is formed and etched into a desired shape, so that wirings 107a and 107b are formed. For the conductive layer, any kind of metals, an alloy thereof, nitride thereof, or the like can be used. In particular, ohmic contact is preferably formed in a portion that is in contact with the semiconductor layers 104a and 104b. In order to form the ohmic contact, the conductive layer is preferably formed using a material whose work function is lower than or equal to the electron affinity of the semiconductor layer. In addition, the conductive layer is not necessarily a single layer, but may be a multi layer.

For example, it is possible to have a structure in which an n-type oxide semiconductor such as indium oxide with a thickness of greater than or equal to 5 nm and less than or equal to 100 nm is deposited so as to be in contact with the semiconductor layers 104a and 104b, and titanium (or titanium nitride) with a thickness of greater than or equal to 20 nm and less than or equal to 100 nm and aluminum (or an aluminum alloy) with a thickness of greater than or equal to 100 nm and less than or equal to 300 nm are deposited.

The wirings 107a and 107b function as a source and a drain of the FET in portions in contact with the semiconductor layers 104a and 104b. This stage is illustrated in FIG. 1D and FIG. 2B. Note that when high-temperature treatment at 300° C. or higher is performed after formation of the wirings 107a and 107b, elements contained in the wirings 107a and 107b diffuse into the semiconductor layers 104a and 104b and adversely affect the characteristics in some cases.

Therefore, after formation of the wirings 107a and 107b, such high-temperature treatment is preferably avoided. Since the wirings 107a and 107b are formed at the final stage of manufacture of a FET, high-temperature treatment is hardly needed after the formation of the wirings 107a and 107b.

The length denoted by L in FIG. 1D corresponds to the channel length of the FET. In addition, by forming the openings under the above conditions, as illustrated in FIG. 2B, portions where the wirings 107a is in contact with the semiconductor layer 104a, the wiring 107b is in contact with the semiconductor layer 104a, the wiring 107b is in contact with the semiconductor layer 104b, and a wiring 107c is in contact with the semiconductor layer 104b overlap with none of end portions (the edges) of the semiconductor layers 104a and 104b. With such a structure, a problem of a reduction in the withstand voltage in the step portion can be eliminated.

Note that characteristics of the end portions (the edges) of the semiconductor layers 104a and 104b are not preferable in many cases. These regions tend to have higher conductivity than the other regions and thus could have caused leakage current in conventional FETs. This is because, in conventional FETs, edges of a semiconductor layer are in contact with a source and a drain (wirings or electrodes that function as a source and a drain).

However, in the FET illustrated in FIG. 2B, the wirings 107a, 107b, and 107c which function as a source and a drain overlap with none of the edges of the semiconductor layers 104a and 104b as described above. Suppose the edges of the semiconductor layers 104a and 104b have high conductivity, leakage current do not flow between the wirings 107a and 107b or the wirings 107b and 107c. Therefore, the off-state current of the FET can be sufficiently low.

In addition, where the edges of the semiconductor layers 104a and 104b are inside the edges of the insulating films 103a and 103b, the semiconductor layers 104a and 104b are formed to be planar as is apparent from FIG. 1D. For example, steps of a semiconductor layer as in the semiconductor layers 204a and 204b in FIG. 4C affect characteristics of a FET. It is difficult to uniformly form such elements having steps, resulting in variation in FET characteristics.

Figure 4C:
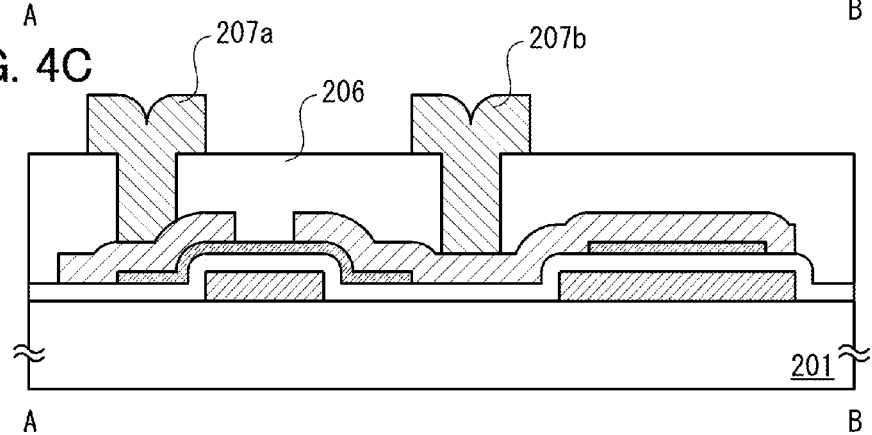
Figure 4D:
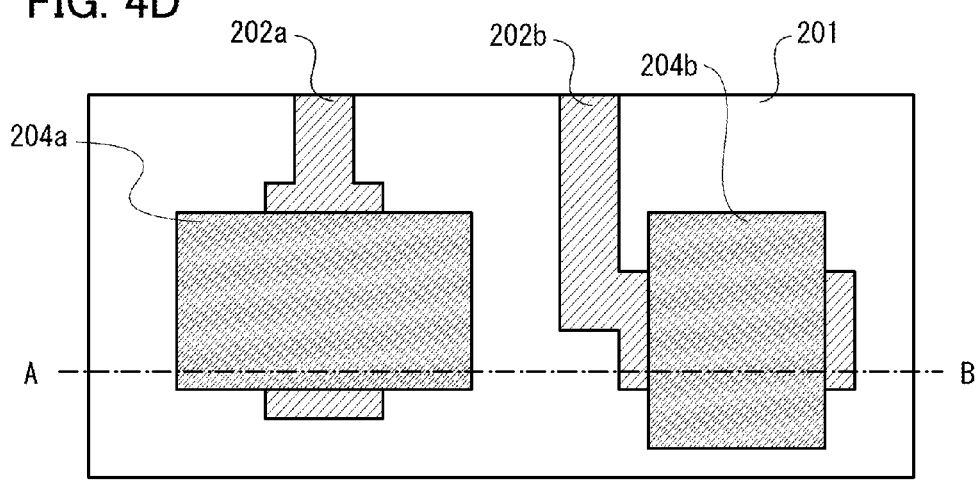

For example, in FIG. 4C, the wirings 205a and 205b are formed so as to be symmetrical to the semiconductor layer 204a and the wiring 202a; however, it is difficult to form every element to have such a shape. Even if there is a slight parallel displacement of the wirings 205a and 205b to the right side (or the left side) in the drawing owing to an error in mask alignment, positional relations of the wirings 205a and 205b and a curved portion of the semiconductor layer 204a become different, which changes characteristics of the FET in some cases. That is, characteristics of the FET may vary.

In particular, when the semiconductor layer contains a certain crystalline component, the variation tends to be large. This is because there are large differences between crystal surface orientations, sizes of crystals, and the like in a planar portion and a curved portion of the semiconductor layer. In the case of zinc oxide, such a crystalline component is generated when zinc oxide is deposited by a sputtering method at room temperature. In the case of an indium-gallium-zinc-based oxide semiconductor, although there are differences depending on the composition, such a crystalline component is also generated when heat treatment at 400° C. or higher is performed.

By contrast, it is easy to form a plane semiconductor layer uniformly over a plane surface. Further, even when there is a slight parallel displacement of the wirings 107a and 107b in FIG. 1D to the right side (or the left side) in the drawing owing to an error in mask alignment, positional relations of the semiconductor layer 104a and the wiring 102a are not changed. That is, variation of characteristics of the FET is less.

Therefore, variation of characteristics of the FET described in this embodiment is less than that of the conventional FET illustrated in FIGS. 4A to 4D. Such a FET is favorably used in a circuit whose variation in threshold voltages needs to be less.

For example, in an active-matrix organic electroluminescent display device, variation in threshold voltages of driving transistors is preferably less in order to prevent display unevenness. In addition, a FET exhibiting high field-effect mobility is preferable as a driving transistor in order to reduce resistance loss. In order to achieve such objects, a FET which has the structure illustrated in FIG. 1D and is manufactured using an oxide semiconductor in a semiconductor layer is suitable. Such a FET exhibits, for example, a field-effect mobility of 10 cm$^2$/Vs or higher, preferably 30 cm$^2$/Vs or higher.

Note that according to the manufacturing processes described in this embodiment, the number of times of mask alignment is 4, which is less than that in the conventional method shown in FIGS. 4A to 4D (5 times of mask alignment). Thus, the manufacturing processes described in this embodiment are effective in reducing the possibilities of defects caused by misalignment and improving yields.

It is also possible to further reduce the number of times of mask alignment by using a multi-tone mask. For example, patterning of the wirings 102a and 102b and the insulating films 103a and 103b (FIG. 1A) and patterning of the semiconductor layers 104a and 104b (FIG. 1B) can be performed by using one mask having three tones (transparent, not transparent, and semitransparent).

In that case, it is preferable that mask alignment be performed after the conductive layer, the insulating film, and the semiconductor layer are successively formed. As a result, the number of times of mask alignment can be further reduced by one. In addition, by forming the semiconductor layer over the insulating film without exposing the insulating film to the air, the interface between the insulating film and the semiconductor layer can be kept clean.

(Embodiment 2)

In this embodiment, an example of a FET having a structure different from that described in Embodiment 1 will be described. FETs illustrated in FIGS. 3A and 3B are each the same as the FET illustrated in FIG. 1D in that the FETs include, over the substrate 101, the wirings 102a and 102b each of which functions as a gate electrode; the insulating film 103a which is provided over the wiring 102a, has substantially the same shape as the wiring 102a, and functions as a gate insulating film; the insulating film 103b which is provided over the wiring 102b, has substantially the same shape as the wiring 102b, and functions as a gate insulating film; the semiconductor layer 104a which is provided over the insulating film 103a and whose edge is placed inside the edge of the insulating film 103a; the semiconductor layer 104b which is provided over the insulating film 103b and whose edge is placed inside the edge of the insulating film 103b; the oxide insulating layer 105; the planarization insulating layer 106; the wiring 107a which is in contact with the semiconductor layer 104a through the opening provided in the oxide insulating layer 105 and the planarization insulating layer 106; and the wiring 107b which is in contact with the semiconductor layer 104b through the opening provided in the oxide insulating layer 105 and the planarization insulating layer 106.

Figure 3A:
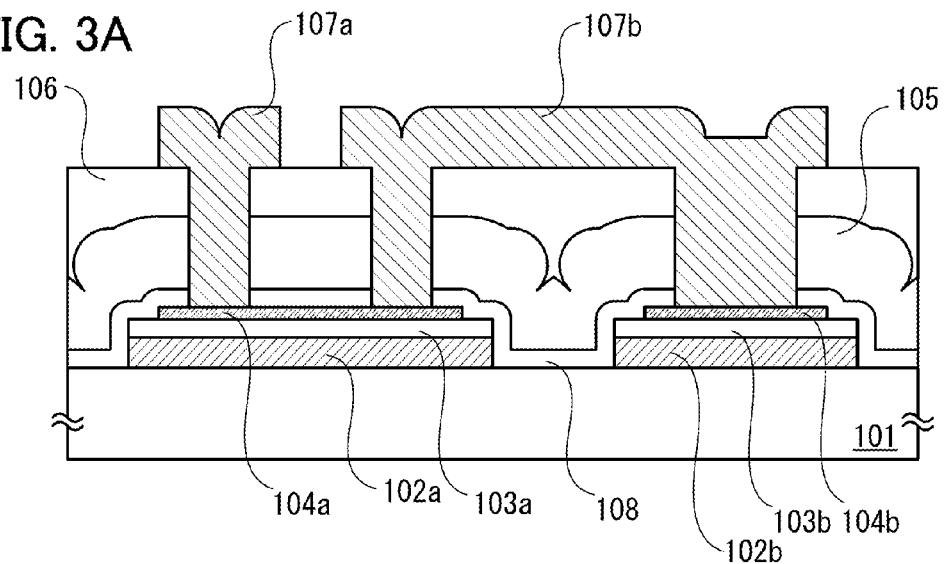
FIGS. 3A and 3B illustrate examples of a field effect transistor of the present invention.
Figure 3B:
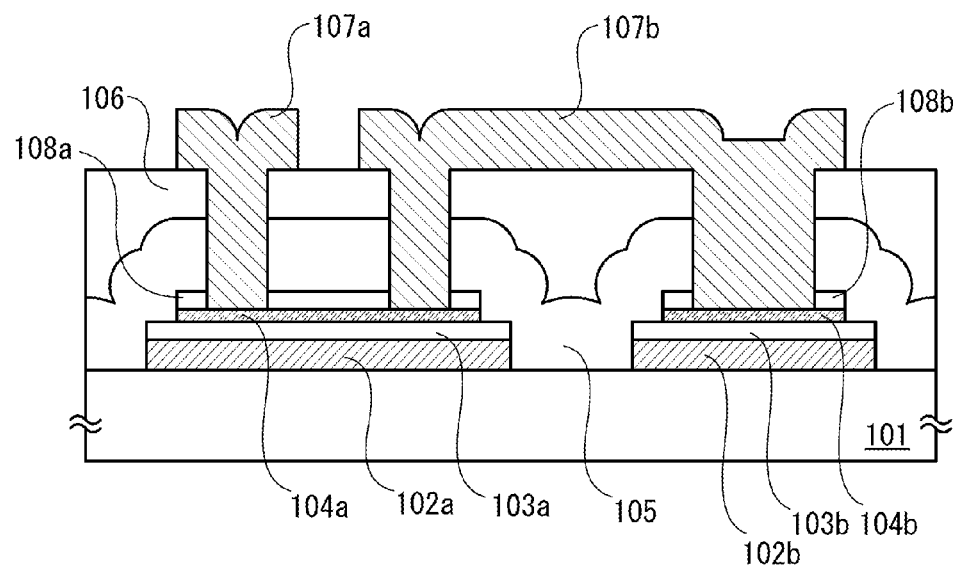

A difference between the FET illustrated in FIG. 1D and each of the FETs illustrated in FIGS. 3A and 3B is whether an insulating film 108 (FIG. 3A) or an insulating film 108a and an insulating film 108b (FIG. 3B) are formed between the semiconductor layer 104a and the oxide insulating layer 105 or between the semiconductor layer 104b and the oxide insulating layer 105.

In addition, a difference between the FET illustrated in FIG. 3A and the FET illustrated in FIG. 3B is whether the insulating films 108, 108a, and 108b have substantially the same shape as the semiconductor layer. The insulating film 108 of the FET illustrated in FIG. 3A has a shape different from the shape of both the semiconductor layer 104a and the semiconductor layer 104b. By contrast, the insulating film 108a and the insulating film 108b of the FET illustrated in FIG. 3B have substantially the same shapes as the semiconductor layer 104a and the semiconductor layer 104b, respectively.

In order to manufacture the FET illustrated in FIG. 3A, the insulating film 108 may be formed after the state illustrated in FIG. 1B. The insulating film 108 can be formed by applying any deposition method; however, it is preferable that a deposition method such as a sputtering method, a CVD method, or a laser ablation method, which is performed in a state where an atmosphere is sufficiently managed.

The insulating film 108 can be formed using any kind of materials. For example, silicon oxide, silicon oxynitride, silicon nitride, aluminum oxide, aluminum nitride, hafnium oxide, aluminum oxynitride, or the like may be used. The electron affinity and the band gap of the insulating film 108 affects distribution of carriers in a semiconductor used for the semiconductor layers 104a and 104b and the insulating film 108 attracts or withdraws carriers.

As a result, leakage current on a back channel side of the FET is affected in some cases. By using an appropriate material for the insulating film 108, characteristics of the FET can be favorable. For example, when an indium-gallium-zinc-based oxide semiconductor is used for the semiconductor layers 104a and 104b, the off-state current can be reduced by using aluminum oxide for the insulating film 108. Needless to say, the insulating film 108 may be formed for another reason.

In addition, the thickness of the insulating film 108 may be greater than or equal to 5 nm and less than or equal to 50 nm. If possible, the hydrogen concentration is preferably $1 \times 10^{20}/cm^3$ or less, more preferably $1 \times 10^{18}/cm^3$ or less. Under such conditions, oxygen is supplied from the oxide insulating layer 105 that is to be formed later, so that hydrogen is fixed or released outside the layer.

When the hydrogen concentration in the insulating film 108 is higher than $1 \times 10^{20}/cm^3$ and the thickness of the insulating film 108 is larger than the above-described upper limit, there is the possibility that oxidation is not sufficiently performed by the oxide insulating layer 105 and characteristics of the FET are degraded by hydrogen remaining in the semiconductor layers 104a and 104b and the insulating films 103a and 103b. For the same reason, it is preferable that another material (particularly a conductive material) be not provided between the semiconductor layer 104a and the oxide insulating layer 105 and between the semiconductor layer 104b and the oxide insulating layer 105.

After the insulating film 108 is formed, the oxide insulating layer 105 may be formed in accordance with the method described in Embodiment 1. The subsequent manufacturing processes may be performed by the method described in Embodiment 1.

In order to manufacture the FET illustrated in FIG. 3B, after the state illustrated in FIG. 1A, the semiconductor layer may be formed and then the insulating film may be formed successively. At this time, after the semiconductor layer is formed, the insulating film is preferably formed without an exposure to the air. That is, when the insulating film is formed successively over the semiconductor layer in the state where the concentration of hydrogen, steam, hydrides, and hydroxides is sufficiently low, the hydrogen concentration in the semiconductor layer can be reduced and the interface between the semiconductor layer and the insulating film can be kept clean. For the formation method, material, thickness, and the like of the insulating film, the above description may be referred to.

After the insulating film is formed, the insulating film is etched and then the semiconductor layer is etched successively. In this process, the insulating film and the semiconductor layer may be etched by using a resist mask and the like formed over the insulating film. Alternatively, after the insulating film is etched by using the resist mask, the resist mask may be removed and then the semiconductor layer may be etched by using the insulating film 108a and 108b, which are formed by the previous etching, as a mask. The semiconductor layer is etched to be the semiconductor layers 104a and 104b.

Through such a process, the insulating film 108a has substantially the same shape as the semiconductor layer 104a, and the insulating film 108b has substantially the same shape as the semiconductor layer 104b. Note that the etching may be performed by wet etching or dry etching. After that, the oxide insulating layer 105 may be formed in accordance with the method described in Embodiment 1. The subsequent manufacturing processes may be performed by the method described in Embodiment 1.

Note that when a multi-tone mask is used in manufacturing the FET illustrated in FIG. 3B, mask alignment is preferably performed after the conductive layer, the insulating film, the semiconductor layer, and the insulating film over the semiconductor layer are successively formed. As a result, the number of times of mask alignment can be further reduced by one. In addition, by forming the semiconductor layer over the insulating film without exposing the insulating film to the air, the interface between the semiconductor layer and the insulating films which are formed over and under the semiconductor layer can be kept clean.

(Embodiment 3)

Figure 5A:
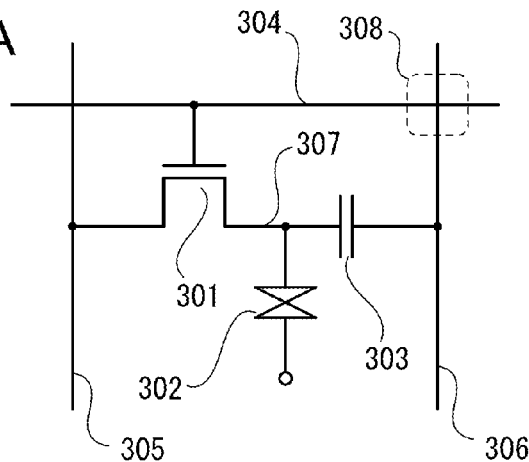
FIGS. 5A and 5B illustrate an example of a semiconductor device including a field effect transistor of the present invention.

In this embodiment, an example of a FET having a structure different from those in Embodiments 1 and 2 and an active-matrix circuit including the FET will be described. An active-matrix circuit is a circuit in which unit circuits illustrated in FIG. 5A are arranged in matrix. The circuit in FIG. 5A is used in display devices in which grayscales are controlled by voltage, such as liquid crystal display devices. Note that in addition to the circuit in FIG. 5A, there are active-matrix circuits used for display devices in which grayscales are controlled by current, such as some electroluminescent display devices.

The circuit illustrated in FIG. 5A includes a FET 301 as a switching element; a display element 302 including a first electrode and a second electrode which face each other; a storage capacitor 303 including a first electrode and a second electrode which face each other; a scan line 304 which transmits a signal for selecting the FET 301; a data line 305 which transmits a signal applied to the display element 302; a capacitor line 306 for supplying a potential to the second electrode of the storage capacitor; and a wiring 307 for connecting a drain of the FET 301, the first electrode of the display element 302, and the first electrode of the storage capacitor 303.

When such unit circuits are arranged in matrix, the scan line 304 and the data line 305, and the scan line 304 and the capacitor line 306 have many intersecting portions. For example, the scan line 304 and the capacitor line 306 intersect with each other in a portion denoted by reference numeral 308 in FIGS. 5A and 5B. In such an intersecting portion, parasitic capacitance is generated, and when the parasitic capacitance is large, signals are delayed. Therefore, the parasitic capacitance is preferably small.

Figure 5B:
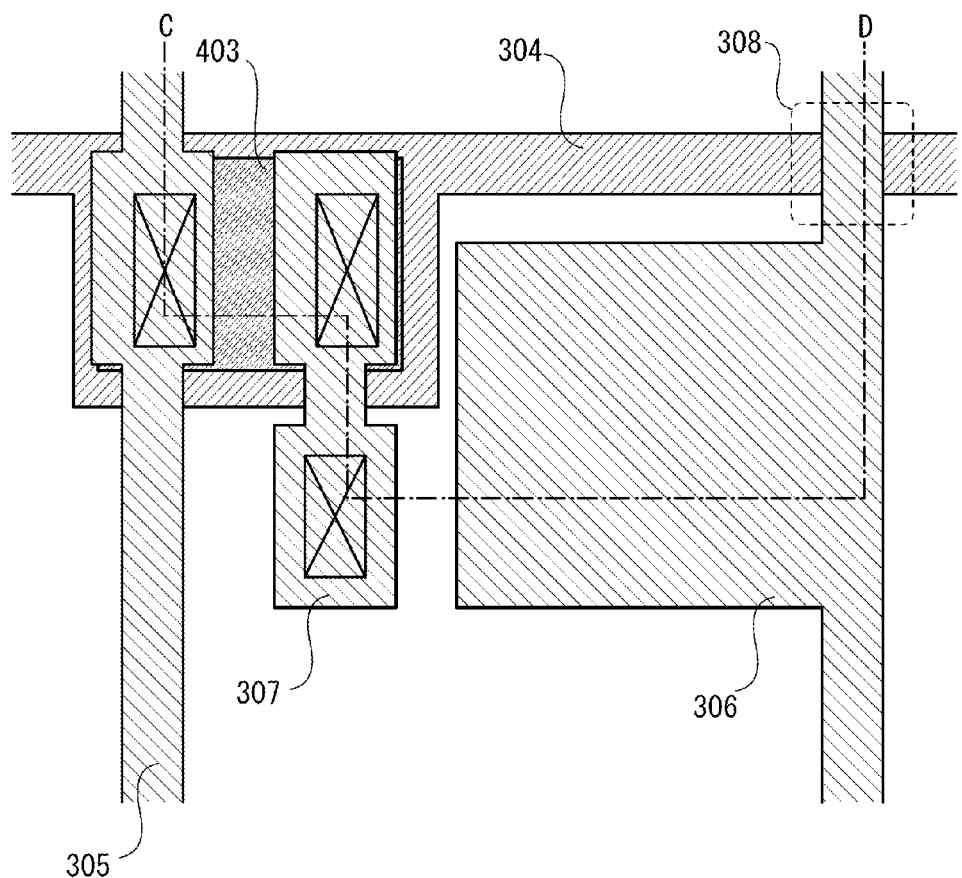
Figure 6A:
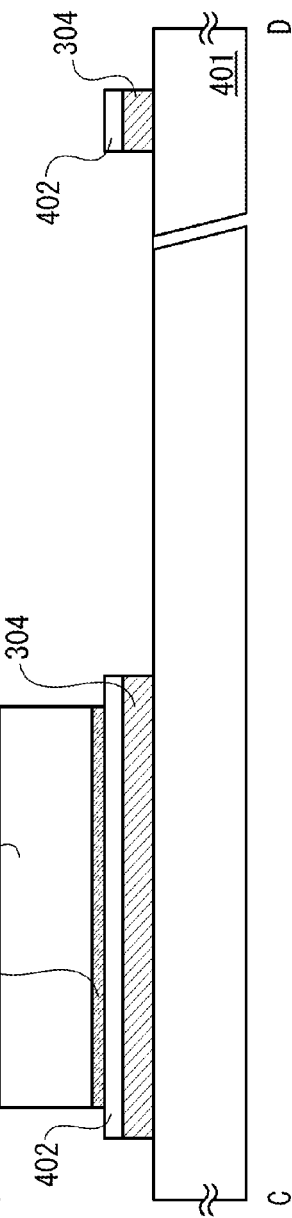
FIGS. 6A and 6B illustrate an example of a semiconductor device including a field effect transistor of the present invention.
Figure 6B:
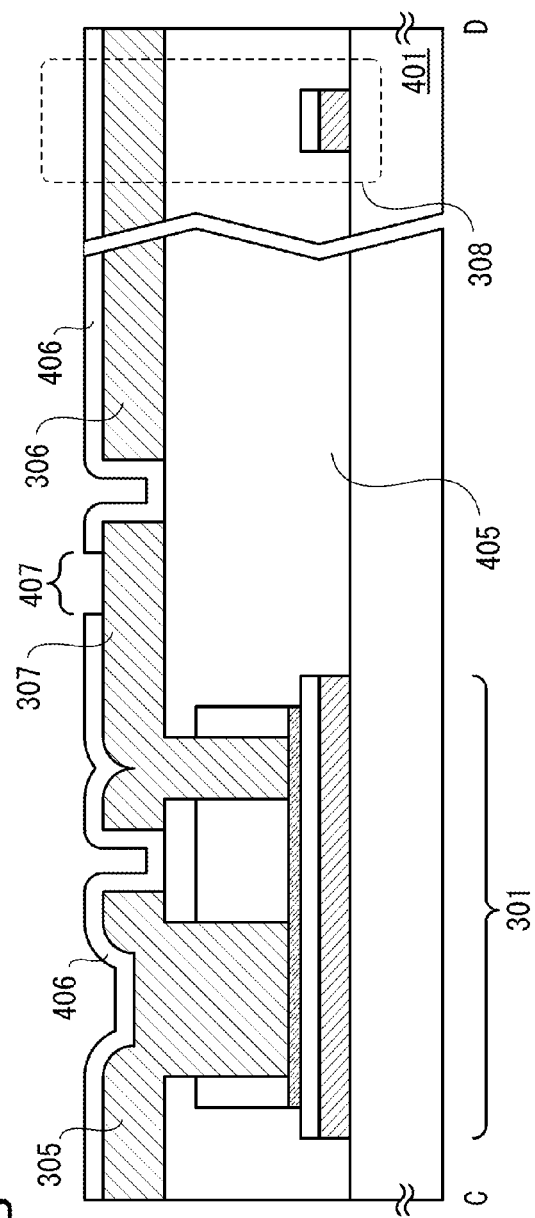

FIG. 5B illustrates a top view of an example in which the circuit illustrated in FIG. 5A is actually formed using wirings and the like. Here, main wirings and a semiconductor layer are illustrated, but insulating films and the like are omitted. The reference numerals are the same as those in FIG. 5A. In addition, FIGS. 6A and 6B schematically illustrate cross-sections along line C-D in FIG. 5B. Processes for manufacturing such a circuit are described below.

First, as illustrated in FIG. 6A, a conductive layer and an insulating film are formed over a substrate 401 and etched selectively, so that the scan line 304 and an insulating film 402 having substantially the same shape as the scan line 304 are formed. Materials, thickness, deposition methods, and the like of the conductive layer and the insulating film may be the same as those in any of the other embodiments.

Then, a semiconductor layer is formed. In this embodiment, after the semiconductor layer is formed, an oxide insulating layer is formed successively without exposing the semiconductor layer to the air. In this manner, the interface between the semiconductor layer and the oxide insulating layer can be kept clean. Materials, thickness, deposition methods, and the like of the semiconductor layer and the oxide insulating layer may be the same as those in any of the other embodiments.

Then, the semiconductor layer and the oxide insulating layer are etched selectively. At this time, the oxide insulating layer and the semiconductor layer may be etched by using a resist mask and the like formed over the oxide insulating layer. Alternatively, after the oxide insulating layer is etched by using a resist mask, the resist mask is separated and the semiconductor layer may be etched by using an oxide insulating layer 404 formed by the above etching as a mask. The semiconductor layer is etched to be a semiconductor layer 403. By such an etching method, the oxide insulating layer 404 has substantially the same shape as the semiconductor layer 403.

Note that these steps can be performed by using a multi-tone mask. For example, by using a three-tone mask, patterning of the scan line 304 and the insulating film 402 and patterning of the semiconductor layer 403 and the oxide insulating layer 404 can be performed at one time. At this time, the conductive layer, the insulating film, the semiconductor layer, and the oxide insulating layer are formed successively, and then the patterning may be performed by using the three-tone mask.

When a multi-tone mask is used in this manner, the number of times of mask alignment is reduced by one, and in addition, the interface between the insulating film 402 and the semiconductor layer 403 is not exposed to the air and the interface state can be kept clean, so that characteristics and reliability of the FET can be improved.

After that, a planarization insulating layer 405 is formed using an organic resin material and the like, and openings reaching the semiconductor layer 403 are formed in the planarization insulating layer 405 and the oxide insulating layer 404. Then, a conductive layer is formed and etched selectively, so that the data line 305, the capacitor line 306, and the wiring 307 are formed.

Further, an insulating film 406 with a thickness of greater than or equal to 60 nm and less than or equal to 1 μm is formed over the data line 305, the capacitor line 306, and the wiring 307. A material for the insulating film 406 may be selected from the materials that can be used for the insulating film 402. In particular, it is preferable to employ a deposition method by which superior step coverage is obtained, and a plasma CVD method is preferably used. For example, a silicon nitride film formed by a plasma CVD method can be used. After that, an opening 407 is provided in the insulating film 406. A planarization insulating layer may be further formed using an organic resin material and the like over the insulating film 406.

Next, although not illustrated, an electrode of the display element is formed. Part of the capacitor line 306 faces the electrode of the display element and forms a capacitor (i.e., the storage capacitor 303) including the insulating film 406 as a dielectric. That is, the electrode of the display element serves as the first electrode of the storage capacitor 303, and part of the capacitor line 306 is the second electrode of the storage capacitor 303. In addition, the other part of the electrode of the display device is the first electrode of the display element 302. Further, the electrode of the display element is connected to the wiring 307 through the opening 407.

As is apparent from FIG. 6B, an insulating layer having a sufficient thickness exits in the portion 308 where the scan line 304 and the capacitor line 306 intersect with each other, so that the parasitic capacitance can be reduced.

As seen in FIG. 6B, end portions of the semiconductor layer 403 are in touch with the planarization insulating layer 405 containing hydrogen, such as an organic resin. Therefore, for example, when any kind of oxide semiconductors is used for the semiconductor layer 403, there is the possibility that semiconductor characteristics in the portions are significantly degraded. Typically, there is the possibility that the conductivity is extremely high. Such a region is assumed to be approximately 1 μm long from the end portion.

However, by providing portions where the data line 305 and the wiring 307 are in contact with the semiconductor layer 403 (i.e., the opening in the oxide insulating layer 404 and the planarization insulating layer 405) so as to avoid such portions where semiconductor characteristics are assumed to be degraded, characteristics of the FET can be prevented from being degraded.

(Embodiment 4)

Figure 7A:
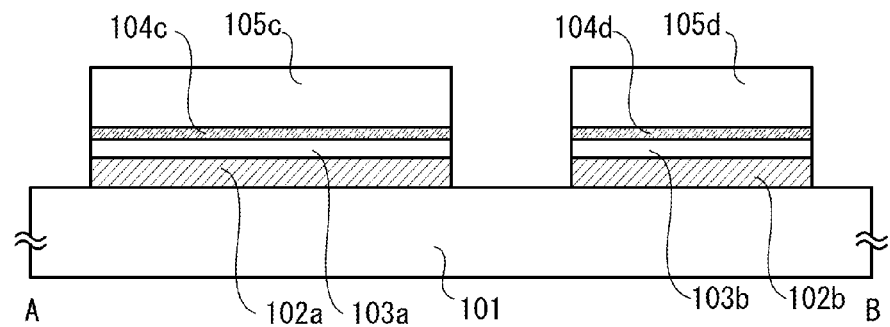
FIGS. 7A to 7C illustrate an example of processes for manufacturing a field effect transistor of the present invention.
Figure 7B:
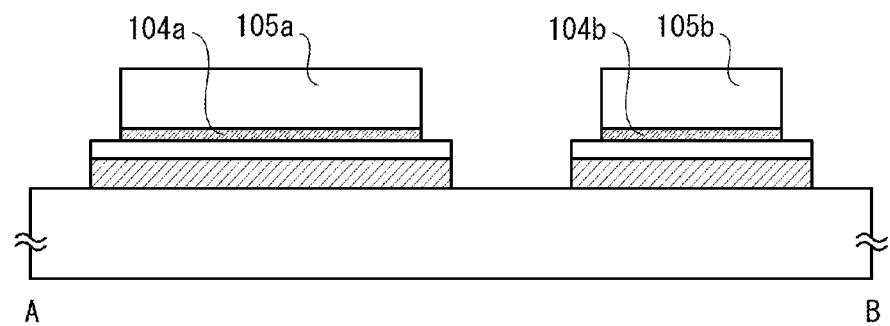
Figure 7C:
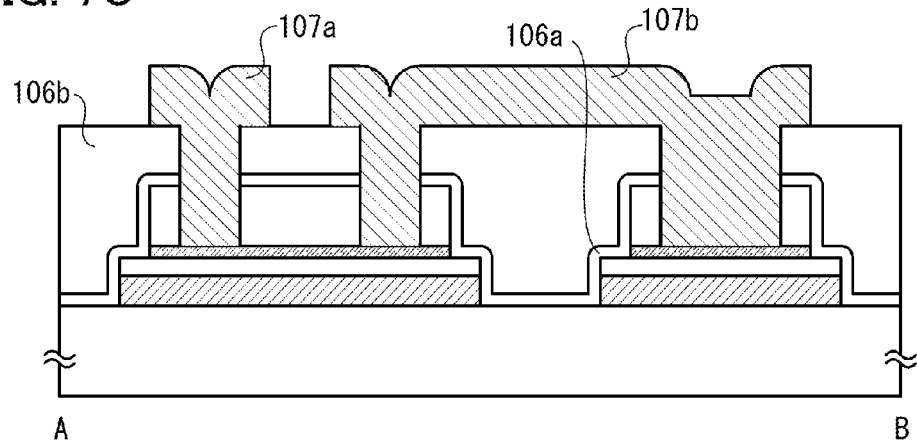

In this embodiment, a method for manufacturing a FET having high reliability will be described with reference to FIGS. 7A to 7C. Note that top views of semiconductor layers and wirings of the FET described in this embodiment are the same as those illustrated in FIGS. 2A and 2B, and schematic cross-sections of a portion along dashed-and-dotted line A-B in FIGS. 2A and 2B are illustrated in FIGS. 7A to 7C. In addition, a main structure is the same as that in any of the other embodiments, so that the embodiments may be referred to.

A conductive layer is formed over the substrate 101. An insulating film is further formed over the conductive layer. Further, a semiconductor layer is formed over the insulating film. In addition, an oxide insulating layer is formed over the semiconductor layer. These layers and the film are preferably formed successively without exposing the substrate 101 to the air. That is, deposition apparatuses of these layers and the film are connected to each other so that the substrate 101 can be transferred between the deposition apparatuses without being taken out in the air. Alternatively, it is possible to use one deposition apparatus in which plural kinds of films can be formed or to combine such apparatuses.

When the insulating film and the oxide insulating layer are formed using a material of the same kind, e.g., silicon oxide formed by a sputtering method, the same apparatus may be used. In addition, in an atmosphere and a source material for formation of the insulating film and the oxide insulating layer, hydrogen and compounds containing hydrogen are preferably reduced sufficiently.

The above measures are greatly effective in preventing the insulating film and the semiconductor layer from being contaminated by atmospheric components and increasing the reliability of the FET manufactured.

For a material, thickness, and the like of the conductive layer, the insulating film, the semiconductor layer, and the oxide insulating layer, Embodiment 1 can be referred to. In particular, all of these layers and the film are preferably formed by a sputtering method. Since these layers and the film are formed over a planar surface without a step and the like, it is possible to use a vacuum evaporation method or a sputtering method which has a problem in step coverage.

Then, these layers and the film which are stacked are etched selectively, so that the wirings 102a and 102b, the insulating films 103a and 103b, semiconductor layers 104c and 104d, and oxide insulating layers 105c and 105d are formed. Needless to say, the wiring 102a, the insulating film 103a, the semiconductor layer 104c, and the oxide insulating layer 105c have substantially the same shape, and the wiring 102b, the insulating film 103b, the semiconductor layer 104d, and the oxide insulating layer 105d have substantially the same shape (see FIG. 7A).

The wirings 102a and 102b each also function as a gate electrode, and the insulating films 103a and 103b each also function as a gate insulating film.

Next, the semiconductor layers 104c and 104d and the oxide insulating layers 105c and 105d are etched selectively, so that the semiconductor layers 104a and 104b and oxide insulating layers 105a and 105b are formed. Needless to say, the semiconductor layer 104a and the oxide insulating layer 105a have substantially the same shape, and the semiconductor layer 104b and the oxide insulating layer 105b have substantially the same shape. By this etching, the semiconductor layers 104a and 104b are each processed into an island shape (see FIG. 7B).

A top view corresponding to this state is illustrated in FIG. 2A. Note that the oxide insulating layers 105a and 105b are not illustrated in FIG. 2A. In addition, the oxide insulating layers 105a and 105b correspond to the oxide insulating layer 105 in FIGS. 1A and 1B and play a role of supplying oxygen to the semiconductor layers 104a and 104b.

Note that when the step in FIG. 7A and the step in FIG. 7B are performed by using a multi-tone mask, photolithography steps can be reduced by one.

Unlike in Embodiment 1, the oxide insulating layers 105a and 105b can be formed over the semiconductor layers 104a and 104b without exposing the semiconductor layers 104a and 104b to the air in this embodiment; thus, the possibility that the semiconductor layers 104a and 104b are contaminated by atmospheric components can be significantly reduced.

As compared with the FET illustrated in FIG. 3B, an insulating film does not exist between the semiconductor layer 104a and the oxide insulating layer 105a and between the semiconductor layer 104b and the oxide insulating layer 105b; therefore, oxygen can be easily supplied to the semiconductor layers 104a and 104b from the oxide insulating layers 105a and 105b.

Next, a first protective insulating layer 106a is formed. The first protective insulating layer 106a can be formed using the same material as the insulating film 108 in Embodiment 2 and is preferably formed by a method by which superior step coverage is obtained. In this embodiment, the thickness of the first protective insulating layer 106a does not have the upper limit. In this embodiment, the first protective insulating layer 106a is provided so as to prevent hydrogen from entering the semiconductor layers 104a and 104b from the outside. Therefore, the thickness is preferably 100 nm or more.

After that, a second protective insulating layer 106b having a planar surface is formed, and contact holes are formed in the second protective insulating layer 106b, so that the wirings 107a and 107b are formed (see FIG. 7C). The wirings 107a and 107b correspond to a source electrode and a drain electrode of the FET. A top view corresponding to this state is illustrated in FIG. 2B.

(Embodiment 5)

In this embodiment, electronic devices including the FET described in any of Embodiments 1 to 4 will be described.

The FET can be used in personal computers, portable communication devices, image display devices, image reproducing devices, imaging devices, game machines, electronic book readers, and the like.

This application is based on Japanese Patent Application serial no. 2010-125443 filed with Japan Patent Office on Jun. 1, 2010, the entire contents of which are hereby incorporated by reference.

What is claimed is:

1. A method for manufacturing an electronic device, comprising steps of:
    forming a first conductive film over a substrate;
    forming a first insulating film over the first conductive film;
    forming a first insulating layer and a first conductive layer;
    forming a semiconductor layer over and in contact with the first insulating layer and a second insulating layer over the semiconductor layer;
    after forming the second insulating layer, etching the semiconductor layer so that the semiconductor layer does not overlap with any side edge of the first conductive layer;
    forming a third insulating layer over the second insulating layer;
    providing an opening reaching the semiconductor layer in the second insulating layer and the third insulating layer; and
    forming a second conductive layer covering the opening.

2. The method for manufacturing an electronic device, according to claim 1, further comprising a step of:
    heating the second insulating layer at a temperature of 200° C. or higher.

3. The method for manufacturing an electronic device, according to claim 1, wherein the second insulating layer is an oxide formed by a sputtering method.

4. The method for manufacturing an electronic device, according to claim 1, wherein the semiconductor layer is formed so that the semiconductor layer does not cross any side edge of the first insulating layer.

5. The method for manufacturing an electronic device, according to claim 1, wherein the second conductive layer is directly in contact with a surface of the semiconductor layer.

6. The method for manufacturing an electronic device, according to claim 1, further comprising a step of:
    diffusing oxygen from the second insulating layer to the semiconductor layer, by heating the second insulating layer.

7. The method for manufacturing an electronic device, according to claim 1, wherein the first conductive film and the first insulating film are successively formed without exposing the substrate to the air.

8. A method for manufacturing an electronic device, comprising steps of:
    forming a first conductive film over a substrate;
    forming a first insulating film over the first conductive film;
    forming a semiconductor film over the first insulating film;
    forming a second insulating film over the semiconductor film;
    after forming the second insulating film, etching the second insulating film, the semiconductor film, the first insulating film, and the first conductive film to form a second insulating layer, a semiconductor layer, a first insulating layer, and a first conductive layer;
    forming a third insulating layer over the second insulating layer;
    providing an opening reaching the semiconductor layer in the second insulating layer and the third insulating layer; and
    forming a second conductive layer covering the opening,
    wherein the semiconductor layer is formed so that the semiconductor layer does not overlap with any side edge of the first insulating layer.

9. The method for manufacturing an electronic device, according to claim 8, further comprising a step of:
    heating the second insulating layer at a temperature of 200° C. or higher.

10. The method for manufacturing an electronic device, according to claim 8, wherein the second insulating layer is an oxide formed by a sputtering method.

11. The method for manufacturing an electronic device, according to claim 8, wherein the second conductive layer is directly in contact with a surface of the semiconductor layer.

12. The method for manufacturing an electronic device, according to claim 8, further comprising a step of:
    diffusing oxygen from the second insulating layer to the semiconductor layer, by heating the second insulating layer.

13. The method for manufacturing an electronic device, according to claim 8, wherein the first conductive film, the first insulating film and the semiconductor film are successively formed without exposing the substrate to the air.

14. A method for manufacturing an electronic device, comprising steps of:
    forming a first conductive layer over a substrate, a first insulating layer over the first conductive layer, a semiconductor layer over and in contact with the first insulating layer and a second insulating layer over the semiconductor layer;
    after forming the second insulating layer, etching the semiconductor layer so that the semiconductor layer does not overlap with any side edge of the first conductive layer;
    forming a third insulating layer over the second insulating layer;
    providing an opening reaching the semiconductor layer in the second insulating layer and the third insulating layer; and
    forming a second conductive layer covering the opening.

15. The method for manufacturing an electronic device, according to claim 14, further comprising a step of:
    heating the second insulating layer at a temperature of 200° C. or higher.

16. The method for manufacturing an electronic device, according to claim 14, wherein the second insulating layer is an oxide formed by a sputtering method.

17. The method for manufacturing an electronic device, according to claim 14, wherein the semiconductor layer is formed so that the semiconductor layer does not cross any side edge of the first insulating layer.

18. The method for manufacturing an electronic device, according to claim 14, wherein the second conductive layer is directly in contact with a surface of the semiconductor layer.

19. The method for manufacturing an electronic device, according to claim 14, further comprising a step of:
    diffusing oxygen from the second insulating layer to the semiconductor layer, by heating the second insulating layer.

* * * * *